United States Patent [19]

Matsuoka

[11] Patent Number: 4,588,952

[45] Date of Patent: May 13, 1986

[54] ARC DISCHARGE ABNORMALITY DETECTING SYSTEM

[75] Inventor: Mamoru Matsuoka, Ibaraki, Japan

[73] Assignee: Japan Atomic Energy Research Institute, Tokyo, Japan

[21] Appl. No.: 560,869

[22] Filed: Dec. 12, 1983

[30] Foreign Application Priority Data

Dec. 16, 1982 [JP] Japan ................................ 57-220555

[51] Int. Cl.[4] ............................................. G01R 31/024

[52] U.S. Cl. .................................. 324/409; 324/140 R

[58] Field of Search ................ 422/907; 324/452, 455, 324/409, 140 R, 140 D

[56] References Cited

U.S. PATENT DOCUMENTS 3,812,431 5/1974 Fry .................................. 324/140 R

*Primary Examiner*—Michael J. Tokar

*Attorney, Agent, or Firm*—Browdy and Neimark

[57] ABSTRACT

The present invention provides an arc discharge abnormality detecting system which in generating source plasma by the arc discharge using a plurality of filaments as the cathode in an ion source, detects an arc discharge current flowing in each of the filaments and detects the abnormality in the arc discharge when the arc discharge currents are not balanced. Further, the present invention provides an arc discharge abnormality detecting system in which said ion source is an ion source used in a neutral beam injector and a logic circuit detects the abnormality in the arc discharge when unbalance in the arc discharge currents larger than a predetermined value exists between the filaments over a predetermined period of time continuously.

6 Claims, 3 Drawing Figures

ARC DISCHARGE ABNORMALITY DETECTING SYSTEM

BACKGROUND OF THE INVENTION

The present invention relates to an arc discharge abnormality detecting system and, more particularly, to the system for detecting the abnormality of arc discharge in generating source plasma by arc discharge using a plurality of filaments as cathodes in an ion source used in a neutron beam injector.

Generally, in the ion source used in the neutral beam injector, the source plasma is generated by a direct current arc discharge of a large current (~1000 A) because of the necessity for producing an ion beam of a high density and a large sectional area. A plurality of filaments are used generally as an arc discharging cathode for a large electric current. In a normal arc discharge in this ion source, the arc discharge current flows substantially uniformly over the entire surface of these filaments. In an abnormality of the arc discharge, however, the arc discharge current flowing in the source is concentrated at a portion of the surface of the filament, causing local overheating and melting at that portion of the filament. This results in the disadvantage of considerably decreasing the life of the filament.

FIG. 1 shows schematically an example of a conventional arc discharge abnormality detecting system, in which an ion source 1 is hollow and includes filaments 2 and 3 therewithin. The example shown in FIG. 1 employs the two filaments. The arc discharge occurs between the inner faces of the walls forming the ion source 1 and the filaments 2, 3 and source plasma is generated over the entire enclosed volume. One terminal of the arc power supply 4 is connected to the wall of the ion source 1 through an arc discharge cut-off switch 9 and a current detector 8 for measuring the entire arc discharge current while the other terminal thereof is connected to one end of each of the filaments 2, 3 through respective resistances 7 for averaging the arc current flowing through the filaments. Designated by 5 and 6 are filament power supplies. The circuit, illustrated in this example, is designed for judging the abnormality of the arc discharge and opening the switch 9 when the indication of the current detector 8 exceeds a predetermined value. This utilizes the phenomenon that the resistance of the arc discharge is lower during abnormal arc discharge than is normal, thereby increasing the arc discharge current. In the abnormal arc discharge, however, there is a case where a large arc discharge current flows in one filament while substantially no arc discharge current flows to the other filament and, therefore, there is substantially no change in the entire arc discharge current measured by the current detector 8. The conventional detecting system of the example shown in FIG. 1 has a disadvantage that the abnormal arc discharge like this is not detectable thereby.

FIG. 2 shows schematically another example of a conventional arc discharge abnormality detecting system, in which reference numerals 1 to 7 and 9 denote the parts corresponding to those of FIG. 1, 11 denotes a probe for determining ion saturation current or floating potential, and 10 denotes a logic circuit for judging arc discharge abnormality from a signal from the probe 11. In this example, the logic circuit 10 judges whether the arc discharge is abnormal or not by means of the signal from the probe 11 and opens the switch 9. This utilizes the phenomenon that the ion saturation current or floating potential changes when the arc discharge is abnormal. However, since these changes are not uniform at all the times, the conventional detecting system of the example shown in FIG. 2 has a disadvantage that it is difficult to form the logic circuit 10 so as to judge the normality or abnormality of arc discharge without fail.

SUMMARY OF THE INVENTION

Accordingly, an object of the present invention is to provide an arc discharge abnormality system which is free of the above-mentioned disadvantages.

Briefly, in accordance with the present invention, an arc discharge abnormality detecting system for use in generating plasma by an arc discharge using a plurality of filaments as the cathode in an ion source is characterized by monitoring the arc discharge current flowing in each of the filaments and detecting the abnormality in the arc discharge when the arc discharge currents are not balanced.

Other objects, aspects and advantages of the present invention will be apparent from the detailed description considered in conjunction with the preferred embodiment of the invention illustrated in the drawings.

DETAILED DESCRIPTION OF THE INVENTION

Figure 1:
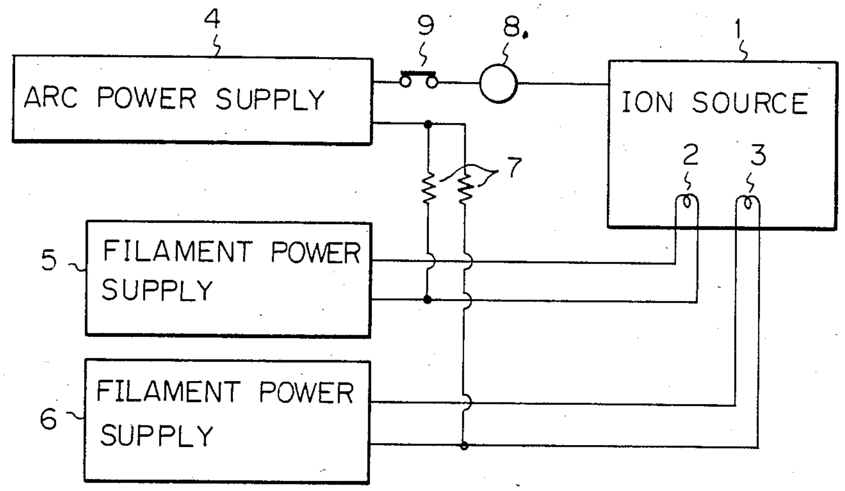
Fig. 1 PRIOR ART
FIG. 1 is a view illustrative of a conventional arc discharge abnormality detecting system.
Figure 2:
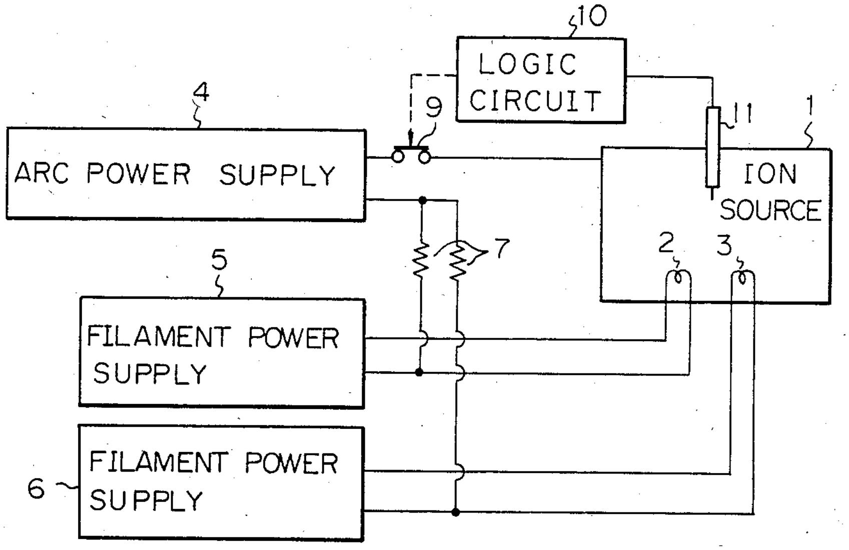
Fig. 2 PRIOR ART
FIG. 2 is a view illustrative of another conventional arc discharge abnormality detecting system.
Figure 3:
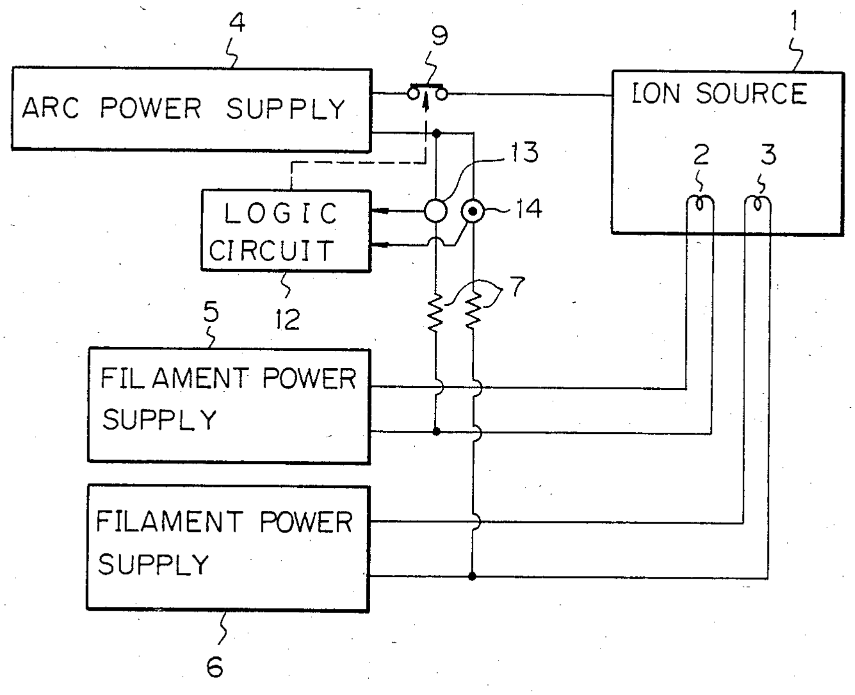
FIG. 3 is a view illustrative of an embodiment of the arc discharge abnormality detecting system according to the present invention.

FIG. 3 is a schematic illustration of an embodiment of the arc discharge abnormality detecting system according to the present invention. In FIG. 3 reference numerals 1 to 7 and 9 denote the parts corresponding to those of FIG. 1, 13 and 14 denote current detectors for determining arc discharge currents flowing in the filaments 2 and 3, respectively, and 12 denotes a logic circuit for judging arc discharge abnormality from signals from the current detectors 13 and 14. An example of the system including, as in the examples shown in FIGS. 1 and 2, two filaments will first be described. The logic circuit 12 takes the difference between the signals from the current detectors 13 and 14, and, when the difference becomes larger than a predetermined value, judges that the arc discharge is abnormal. When the logic circuit 12 judges that the arc discharge is abnormal, the switch 9 is opened.

In examples including three or more filaments, judgement whether the arc discharge is normal or abnormal can be made by measuring arc discharge currents flowing in each of the filaments, respectively, to obtain the differences therebetween. For example, the greatest and least values are taken from the measured values of the arc discharge current flowing in each of the filaments and the arc discharge 13 judged to be normal or abnormal according as these values are lower or higher than the predetermined values. In the case where too many filaments are included to measure the discharge currents of all these filaments, respectively, for judging whether the arc discharge is normal or not by using the differences therebetween, the filaments may be divided into groups. For example, in case there are 100 filaments, they are divided into ten groups each having ten filaments, arc discharge currents flowing in these filaments are measured for each group, and the judgement as to whether the arc discharge is normal or not is made from the difference between these values.

In general, an arc discharge current is overlapped by high frequency noise. Further, at the start of an arc discharge, the arc discharge currents flowing in the filaments become unbalanced for a very short period of time. In order to prevent misjudgement that the arc discharge is abnormal from these phenomena, the system according to the present invention may include a timing element as shown in FIG. 3 for finding a difference between the signals of the current detectors 13 and 14 by the logic circuit 12 and judging that the arc discharge is abnormal when the difference is continuously larger than the predetermined value over a predetermined period of time.

In the arc discharge abnormality detecting system according to the present invention having the above-described construction, it is possible to detect with certainty an arc discharge abnormality in which there is no substantial change in the entire arc discharge current. Further, judgement whether the arc discharge is normal or not can be rendered with high certainty simply by judging whether the difference between two signals is lower than the predetermined value or not. In other words, according to the present invention, it is possible to detect with high certanty the arc discharge abnormality including such abnormality that there is no substantial change in the entire arc discharge current by a simple logic circuit.

It should be apparent to those skilled in the art that various modifications may be made in the present invention without departing from the spirit and scope thereof as described in the specification and defined in the appended claims.

What is claimed is:

1. A method for detecting arc discharge abnormality when generating source plasma by means of an arc discharge using a plurality of filaments as the cathode in an ion source, comprising the steps of:

detecting an arc discharge current flowing in each of the filaments, and detecting an abnormality in the arc discharge when the arc discharge currents are not balanced.

2. The method as set forth in claim 1, wherein said ion source is an ion source used in a neutron beam injector and further comprising using a logic circuit to determine the abnormality in the arc discharge when unbalance in the arc discharge currents larger than a predetermined value exists between the filaments over a predetermined period of time continuously.

3. In a system for generating source plasma by arc discharge using an ion source coupled with an arc power supply and a plurality of filaments as cathodes in said ion source, apparatus for preventing overheating and melting of one or more of the filaments due to abnormal arc discharge, comprising:

means for measuring arc discharge currents flowing in each of said filaments, and logic circuit means for uncoupling said ion source from said arc power supply when said measured currents are judged to be unbalanced.

4. The apparatus of claim 3, wherein said logic circuit means includes means for comparing said currents with a predetermined threshold.

5. The apparatus of claim 3, wherein said logic circuit means includes means for preventing misjudgement that the measured currents are unbalanced.

6. The apparatus of claim 5, wherein said means for preventing misjudgement comprises first means for determining the difference between the measured currents, and second means for determining whether said difference is continuously larger than a predetermined value over a predetermined period of time.

* * * * *